(12) United States Patent
Goswami

(10) Patent No.: US 8,372,671 B2
(45) Date of Patent: Feb. 12, 2013

(54) SOLID STATE DEVICES WITH SEMI-POLAR FACETS AND ASSOCIATED METHODS OF MANUFACTURING

(75) Inventor: Jaydeb Goswami, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 179 days.

(21) Appl. No.: 12/819,672

(22) Filed: Jun. 21, 2010

(65) Prior Publication Data

US 2011/0309324 A1    Dec. 22, 2011

(51) Int. Cl.
*H01L 21/20* (2006.01)
(52) U.S. Cl. ............ 438/41; 438/47; 438/481; 438/496; 257/E21.102; 257/E21.112
(58) Field of Classification Search .............. 438/41, 438/481
See application file for complete search history.

(56) References Cited

U.S. PATENT DOCUMENTS

| 6,635,901 | B2 | 10/2003 | Sawaki et al. | |
|---|---|---|---|---|
| 6,969,670 | B2 | 11/2005 | Biwa et al. | |
| 8,008,170 | B2 * | 8/2011 | Liang et al. | 438/481 |
| 2005/0093099 | A1 * | 5/2005 | Koike et al. | 257/615 |
| 2006/0054929 | A1 | 3/2006 | Nakayama et al. | |
| 2007/0205407 | A1 | 9/2007 | Matsuo et al. | |
| 2009/0039361 | A1 * | 2/2009 | Li et al. | 257/94 |
| 2009/0098343 | A1 * | 4/2009 | Arena et al. | 428/172 |
| 2010/0025656 | A1 | 2/2010 | Raring et al. | |

OTHER PUBLICATIONS

Feezell, D.F. et al., Development of Nonpolar and Semipolar InGaN/GaN Visible Light-Emitting Diodes, MRS Bulletin, vol. 34, pp. 318-323, May 2009.
Ni, X. et al., Nonpolar m-plane GaN on patterned Si(112) substrates by metalorganic chemical vapor deposition, Applied Physics Letters 95, 111102 (2009).

* cited by examiner

*Primary Examiner* — Stephen W Smoot
(74) *Attorney, Agent, or Firm* — Perkins Coie LLP

(57) ABSTRACT

Solid state lighting devices with semi-polar or non-polar surfaces and associated methods of manufacturing are disclosed herein. In one embodiment, a solid state lighting device includes a substrate material having a substrate surface and an epitaxial silicon structure in direct contact with the substrate surface. The epitaxial silicon structure has a sidewall extending away from the substrate surface. The solid state lighting device also includes a semiconductor material on at least a portion of the sidewall of the epitaxial silicon structure. The semiconductor material has a semiconductor surface that is spaced apart from the substrate surface and is located on a semi-polar or non-polar crystal plane of the semiconductor material.

13 Claims, 8 Drawing Sheets

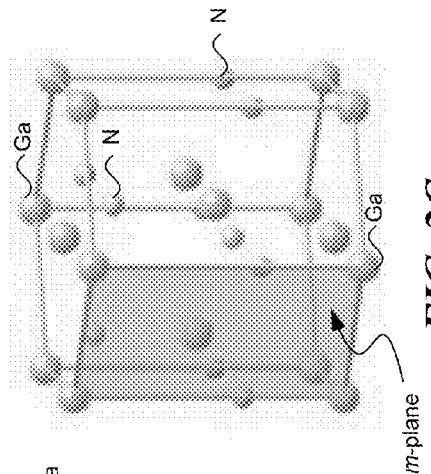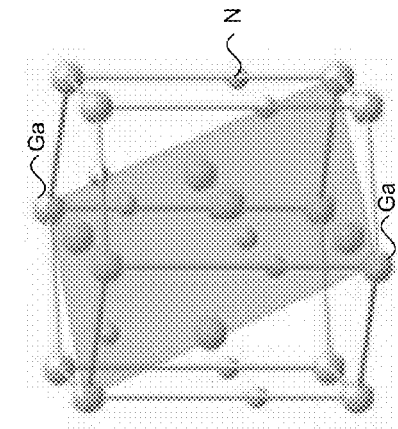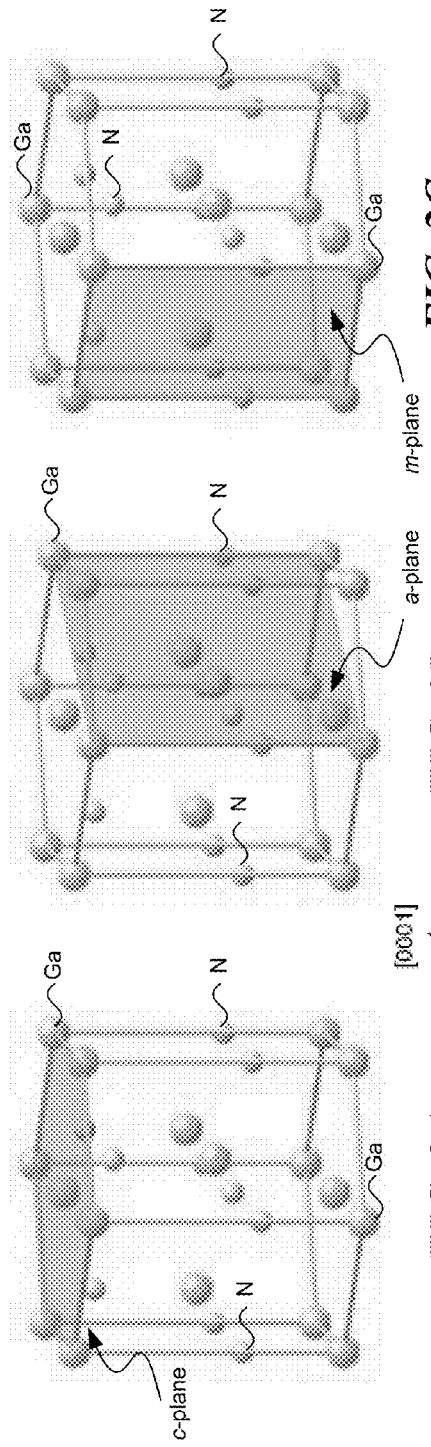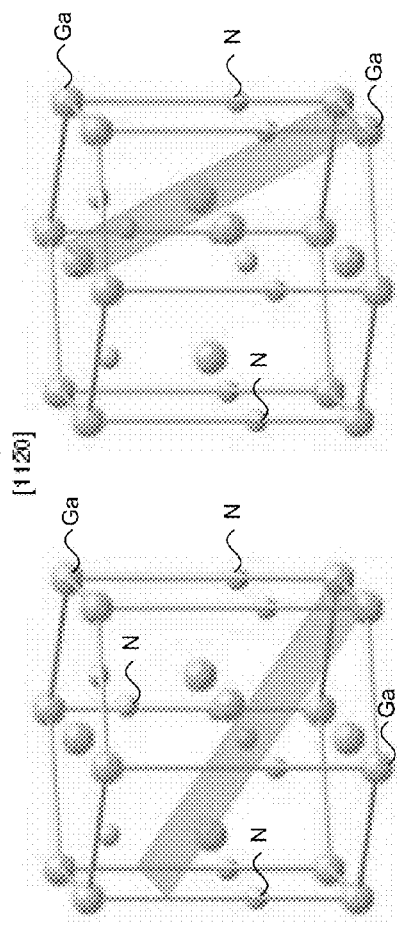

SOLID STATE DEVICES WITH SEMI-POLAR FACETS AND ASSOCIATED METHODS OF MANUFACTURING

TECHNICAL FIELD

The present technology is directed generally to solid state lighting ("SSL") devices with semi-polar or non-polar crystalline facets and associated methods of manufacturing.

BACKGROUND

SSL devices generally use semiconductor light emitting diodes ("LEDs"), organic light emitting diodes ("OLEDs"), laser diodes ("LDs"), and/or polymer light emitting diodes ("PLEDs") as sources of illumination rather than electrical filaments, a plasma, or a gas. FIG. 1 is a cross-sectional diagram of a portion of a conventional indium-gallium nitride ("InGaN") LED 10. As shown in FIG. 1, the LED 10 includes a substrate 12 (e.g., silicon carbide, sapphire, gallium nitride, or silicon), an N-type gallium nitride ("GaN") material 14, a GaN/InGaN multi quantum well ("MQW") 16, and a P-type GaN material 18 on top of one another in series. The LED 10 also includes a first contact 20 on the P-type GaN material 18 and a second contact 22 on the N-type GaN material 14.

The GaN/InGaN materials of the LED 10 have a wurtzite crystal formation in which hexagonal rings of gallium (or indium) are stacked on top of hexagonal rings of nitrogen atoms. According to conventional techniques, the GaN/InGaN materials are typically grown on silicon wafers with the Si(1,1,1) crystal orientation. The GaN/InGaN materials are thus grown along a direction generally perpendicular to the hexagonal rings of gallium (or indium) and nitrogen atoms. As discussed in more detail later, the growth direction of the GaN/InGaN materials may negatively impact the optical efficiency of the LED 10. Also, silicon wafers with the Si(1,1,1) crystal orientation can be expensive to produce because conventional production techniques typically yield the Si(1,0,0) crystal orientation. Thus, chemical, thermal, and/or other types of additional processing may be required to expose and/or otherwise provide the Si(1,1,1) crystal facets. Accordingly, several improvements in increasing the optical efficiency while reducing the manufacturing costs of LEDs may be desirable.

BRIEF DESCRIPTION OF THE DRAWINGS

FIGS. 2A-2F are schematic perspective views of various crystal planes in a GaN/InGaN material in accordance with embodiments of the technology.

DETAILED DESCRIPTION

Figure 1:
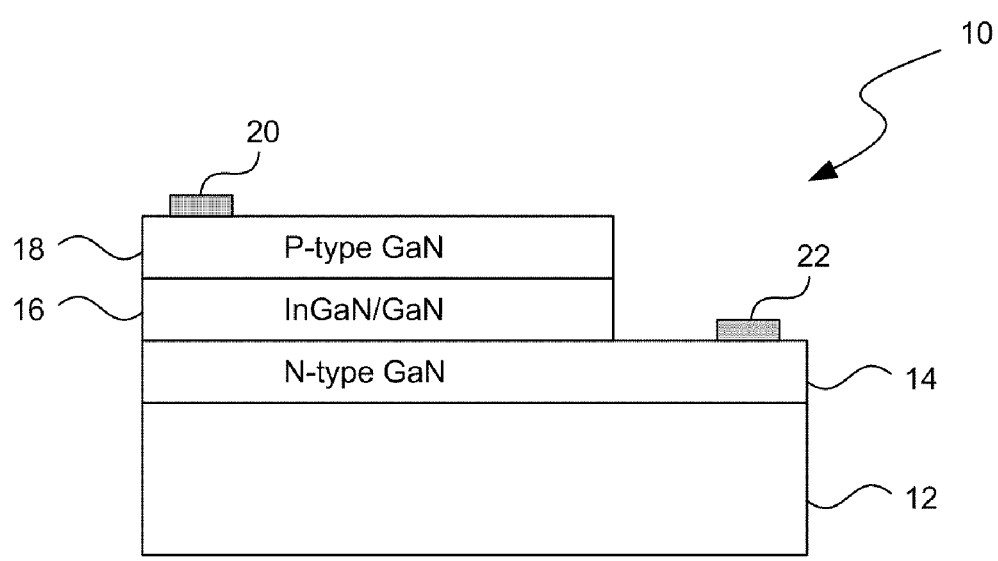
FIG. 1 is a cross-sectional view of a portion of an LED in accordance with the prior art.

Various embodiments of SSL devices and associated methods of manufacturing are described below. The term "microelectronic substrate" is used throughout to include substrates upon which and/or in which SSL devices, microelectronic devices, micromechanical devices, data storage elements, read/write components, and other features are fabricated. The term "optical efficiency" is defined as a percentage of photon output per unit electron input. A person skilled in the relevant art will also understand that the technology may have additional embodiments, and that the technology may be practiced without several of the details of the embodiments described below with reference to FIGS. 2A-5C.

In the following discussion, an LED having GaN/InGaN materials is used as an example of an SSL device in accordance with embodiments of the technology. Several embodiments of the SSL device may also include an LED and/or a laser diode ("LD") having at least one of gallium arsenide (GaAs), aluminum gallium arsenide (AlGaAs), gallium arsenide phosphide (GaAsP), aluminum gallium indium phosphide (AlGaInP), gallium(III) phosphide (GaP), zinc selenide (ZnSe), boron nitride (BN), aluminum nitride (AlN), aluminum gallium nitride (AlGaN), aluminum gallium indium nitride (AlGaInN), and/or other suitable semiconductor materials. The foregoing semiconductor materials may have generally similar or different crystal structures than GaN/InGaN materials. However, the following definitions of polar, non-polar, and semi-polar planes may still apply.

FIGS. 2A-2F are schematic perspective views of various crystal planes in a portion of a GaN/InGaN material. In FIGS. 2A-2F, Ga (or Ga/In) and N atoms are schematically shown as large and small spheres, respectively. As shown in FIGS. 2A-2F, the GaN/InGaN material has a wurtzite crystal structure with various lattice planes or facets as represented by corresponding Miller indices. A discussion of the Miller index can be found in the *Handbook of Semiconductor Silicon Technology* by William C. O'Mara.

As used hereinafter, a "polar plane" generally refers to a crystal plane in a crystal structure that contains only one type of atoms. For example, as shown in FIG. 2A, the polar plane denoted as the "c-plane" in the wurtzite crystal structure with a Miller index of (0001) contains only gallium atoms. Similarly, other polar planes in the wurtzite crystal structure may contain only nitrogen atoms and/or other suitable type of atoms.

As used hereinafter, a "non-polar plane" generally refers to a crystal plane in a crystal structure that is generally perpendicular to a polar plane (e.g., to the c-plane). For example, FIG. 2B shows a non-polar plane denoted as the "a-plane" in the wurtzite crystal structure with a Miller index of (11$\bar{2}$0). FIG. 2C shows another non-polar plane denoted as the "m-plane" in the wurtzite crystal structure with a Miller index of (10$\bar{1}$0). Both the a-plane and the m-plane are generally perpendicular to the c-plane shown in FIG. 2A.

As used hereinafter, a "semi-polar plane" generally refers to a crystal plane in a crystal structure that is canted relative to a polar plane (e.g., to the c-plane) without being perpendicular to the polar plane. For example, as shown in FIGS. 2D-2F, each of the semi-polar planes in the wurtzite crystal structure with Miller indices of (10$\bar{1}$3), (10$\bar{1}$1), and (11$\bar{2}$2) form an angle with the c-plane shown in FIG. 2A. The angle is greater than 0° but less than 90°. Even though only particular examples of crystal planes are illustrated in FIGS. 2A-2F, each of the polar, non-polar, and semi-polar planes can also include other crystal planes not illustrated in FIGS. 2A-2F.

FIGS. 3A-3I are cross-sectional and top views of a portion of a microelectronic substrate 100 undergoing a process of forming an SSL device in accordance with embodiments of the technology. Even though only certain processing stages are illustrated in FIGS. 3A-3I, the process of forming the SSL device can also include other stages for forming a lens, a mirror material, a support structure, conductive interconnects, and/or other suitable mechanical/electrical components (not shown).

Figure 3A:
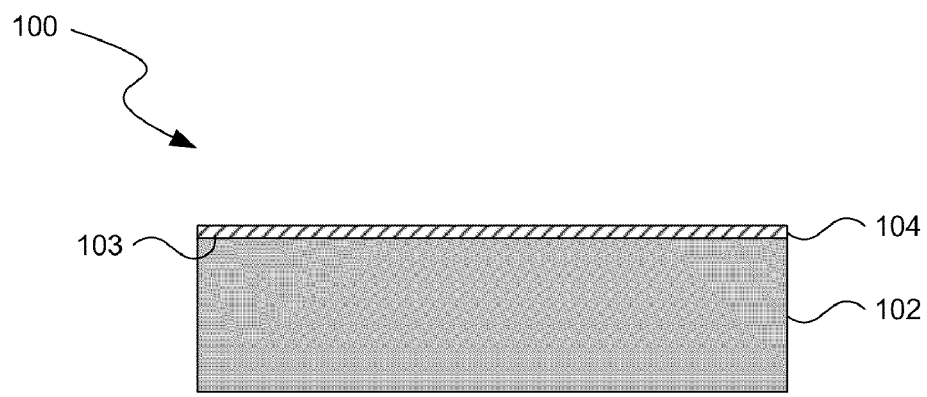
FIGS. 3A-3K are cross-sectional and top views of a portion of a microelectronic substrate undergoing a process of forming an SSL device in accordance with embodiments of the technology.

As shown in FIG. 3A, an initial stage of the process can include forming a masking material 104 on a substrate surface 103 of a substrate material 102. In one embodiment, the substrate material 102 can include silicon (Si), at least a portion of which has the Si(1,0,0) crystal orientation at the substrate surface 103. In other embodiments, the substrate material 102 can include silicon with other crystal orientations (e.g., Si(1,1,1)), AlGaN, GaN, silicon carbide (SiC), sapphire ($Al_2O_3$), a combination of the foregoing materials and/or other suitable substrate materials.

In one embodiment, the masking material 104 includes silicon nitride (SiN), which may be deposited onto the substrate material 102 via chemical vapor deposition ("CVD"), atomic layer deposition ("ALD"), and/or other suitable techniques. In other embodiments, the masking material 104 can include silicon dioxide ($SiO_2$), which may be formed on the substrate material via CVD, ALD, thermal oxidation, and/or other suitable techniques. In further embodiments, the masking material 104 can include a photoresist and/or other suitable masking compositions. The masking material 104 can have a thickness of about 50 to about 100 Angstroms or other suitable thicknesses.

Figure 3B:
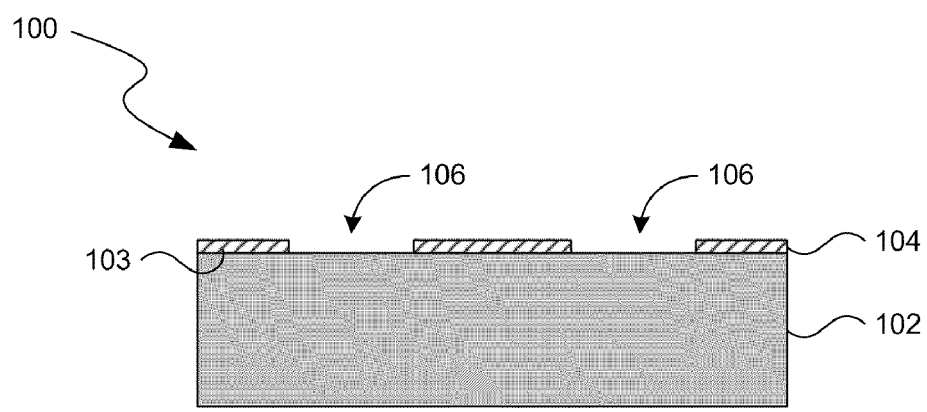
Figure 3C:
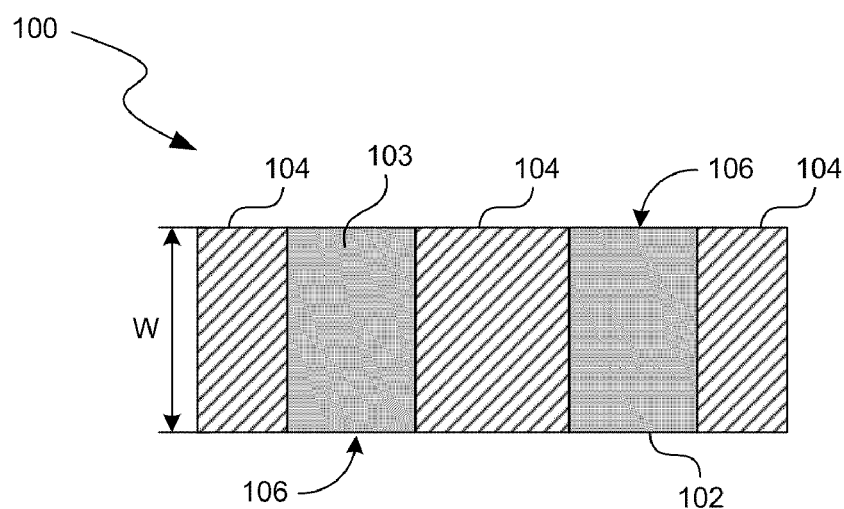

FIGS. 3B and 3C are cross-sectional and top views of the microelectronic substrate 100, respectively, during another stage of the process, in which a plurality of first openings 106 are formed in the masking material 104. The individual first openings 106 expose a portion of the substrate surface 103 of the substrate material 102. As shown in FIG. 3C, in the illustrated embodiment, the first openings 106 individually include a channel extending along the full width W of the substrate material 102. In other embodiments, the first openings 106 can be one or more slots (not shown) that individually extend along only a portion of the width W. In further embodiments, the first openings 106 can be apertures and/or other suitable shapes. The channels, slots, apertures, and/or other suitable openings can have a rectangular, a trapezoidal, parabolic, semicircular, or other suitably shaped cross sections.

In one embodiment, forming the first openings 106 can include depositing a photoresist (not shown) on the masking material 104, patterning the photoresist via photolithography to define the first openings 106, and removing a portion of the masking material 104 via wet etching, dry etching, laser ablation, and/or other suitable techniques. In another embodiment, the masking material 104 can include a photoresist, and forming the first openings 106 can include photo patterning the masking material 104 itself based on the desired first openings 106. In further embodiments, the first openings 106 may be formed via other suitable techniques.

Figure 3D:
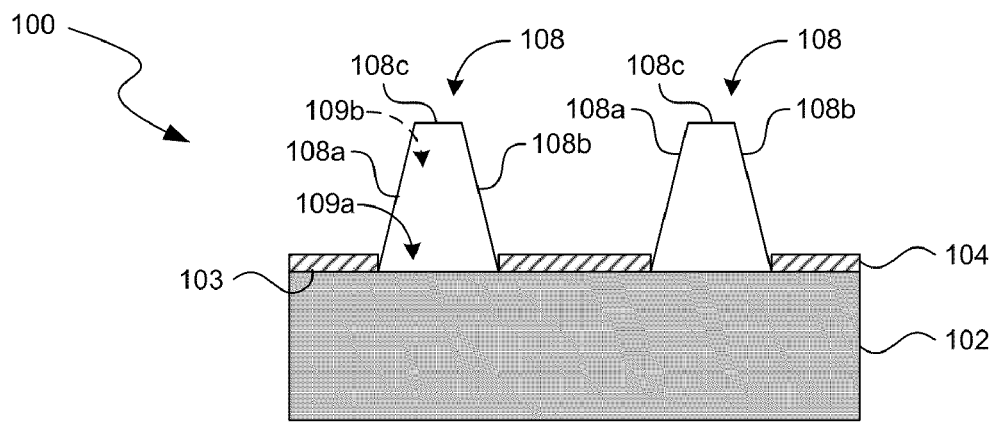
Figure 3E:
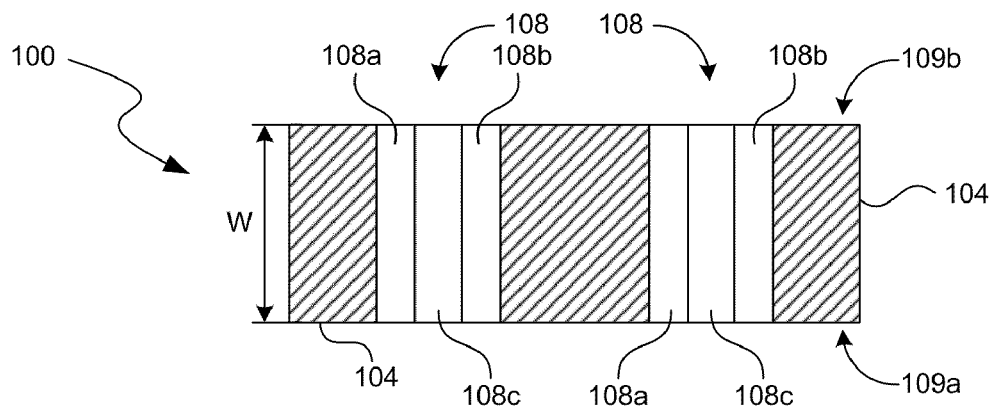

FIGS. 3D and 3E are cross-sectional and top views of the microelectronic substrate 100, respectively, during another stage of the process, in which epitaxial silicon structures 108 are formed on the substrate material 102 in the first openings 106. Suitable techniques for forming the epitaxial silicon structures 108 can include CVD, ALD, and/or other suitable techniques. As shown in FIGS. 3D and 3E, the individual epitaxial silicon structures 108 include a first sidewall 108a, a second sidewall 108b, and a top wall 108c all extending between first and second ends 109a and 109b. The first and second sidewalls 108a and 108b extend away from the substrate surface 103 of the substrate material 102 and terminate at the top wall 108c. The first and second ends 109a and 109b have a generally trapezoidal shape.

The inventor has observed that the first and second sidewalls 108a and 108b of the epitaxial silicon structures 108 have the Si(1,1,1) crystal orientation while the top wall 108c has the Si(1,0,0) crystal orientation when silicon is deposited via epitaxial growth. Without being bound by theory, it is believed that the Si(1,1,1) crystal orientation would result in lower surface energy for the deposited silicon when compared to other crystal orientations. As a result, the deposited silicon atoms tend to grow along the Si(1,1,1) crystal orientation to form the first and second sidewalls 108a and 108b as shown in FIG. 3D.

Even though the epitaxial silicon structures 108 shown in FIG. 3D have trapezoidal cross sections, in certain embodiments, the epitaxial silicon structures 108 can have a triangular cross section (not shown). The first and second sidewalls 108a and 108b can extend away from the substrate surface 103 of the substrate material 102 and terminate at an apex (not shown). In one embodiment, forming epitaxial silicon structures 108 with triangular cross sections can include increasing a deposition duration and/or adjusting other suitable deposition parameters. In further embodiments, the epitaxial silicon structures 108 can have a hexagonal pyramid shape and/or other suitable geometric shapes.

Figure 3F:
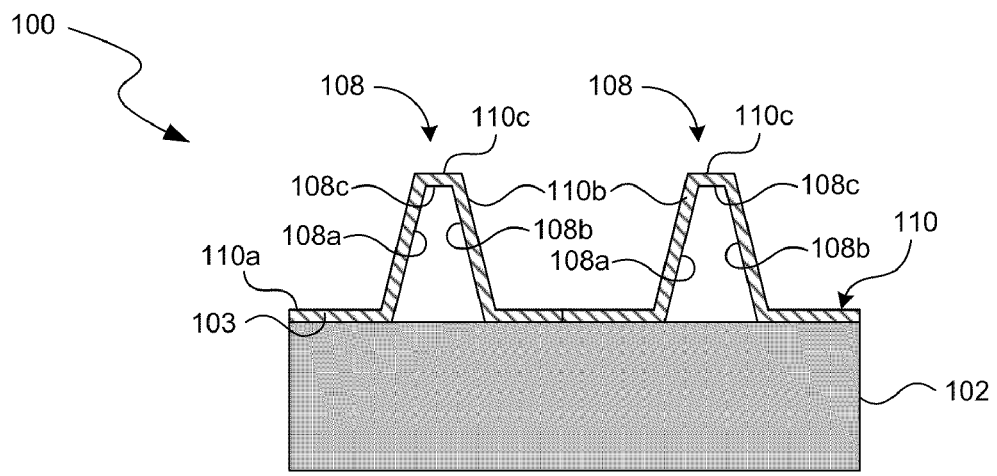

FIG. 3F shows an optional stage of the process, in which a buffer material 110 is formed on the epitaxial silicon structures 108 and the substrate surface 103 of the substrate material 102. As shown in FIG. 3F, the buffer material 110 can conform generally to the substrate surface 103 of the substrate material 102 and the epitaxial silicon structures 108. The buffer material 110 can include a first portion 110a on the substrate surface 103 of the substrate material 102, a second portion 110b on the first and second sidewalls 108a and 108b of the epitaxial silicon structures 108, and a third portion 110c on the top wall 108c of the epitaxial silicon structures 108. The buffer material 110 can include aluminum nitride (AlN), aluminum-gallium nitride (AlGaN), zinc nitride (ZnN), and/or other suitable materials formed via metal-organic CVD ("MOCVD"), molecular beam epitaxy ("MBE"), liquid phase epitaxy ("LPE"), hydride vapor phase epitaxy ("HVPE"), and/or other suitable techniques. In further embodiments, the buffer material 110 may be omitted.

Figure 3G:
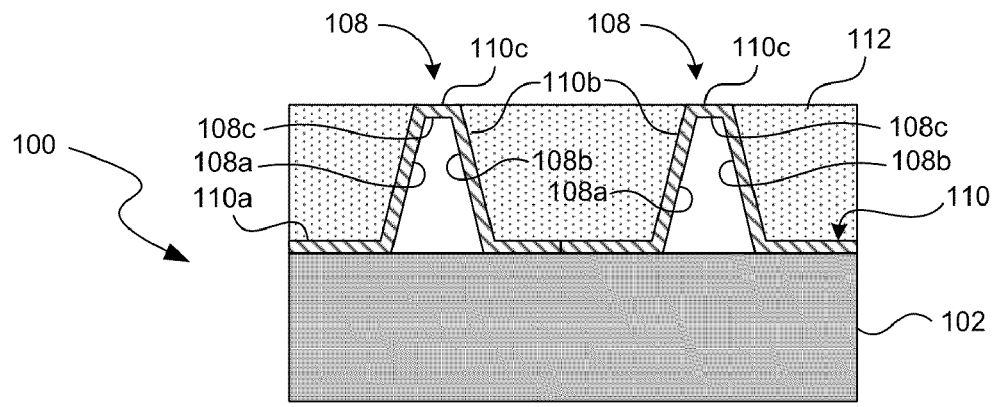

FIG. 3G shows another stage of the process in which an insulating material 112 is formed on the substrate material 102 with the optional buffer material 110. The insulating material 112 can include silicon nitride (SiN), silicon dioxide ($SiO_2$) and/or other suitable materials deposited via CVD, ALD, spin-on-dielectrics, and/or other suitable techniques. In the illustrated embodiment, the insulating material 112 substantially encapsulates the first and second portions 110a and 110b of the optional buffer material 110. The third portion 110c of the optional buffer material 110, however, is exposed through the insulating material 112. In other embodiments, the insulating material 112 may also cover the third portion 110c of the optional buffer material and completely encapsulate the first, second, and third portions 110a-110c of the optional buffer material 110 and the epitaxial silicon structures 108.

Figure 3H:
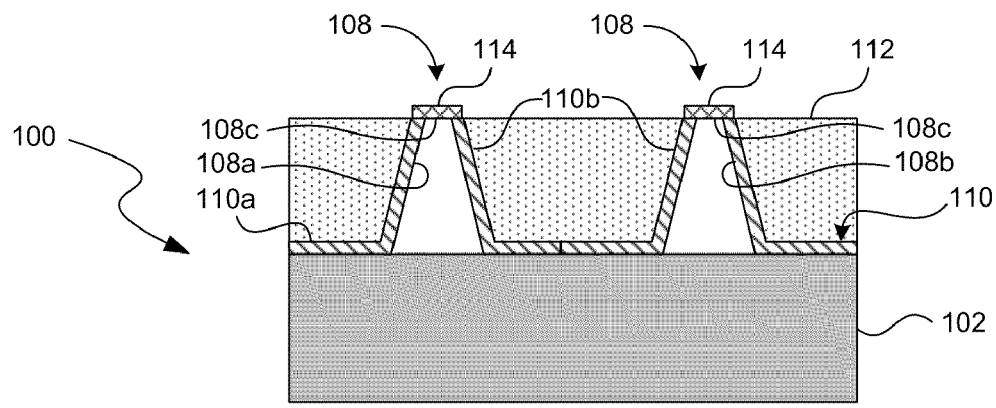

FIG. 3H shows another stage of the process, in which at least the third portion 110c of the optional buffer material 110 is removed. In one embodiment, removing the third portion 110c of the optional buffer material 110 can include polishing the microelectronic substrate 100 via chemical-mechanical polishing (CMP), electrochemical-mechanical polishing (ECMP), and/or other suitable polishing techniques. The polishing operation can terminate at the top wall 108c of the epitaxial silicon structures 108, or the process can continue to remove a portion of the epitaxial silicon structures 108. In another embodiment, the third portion 110c of the optional buffer material 110 shown in FIG. 3G may be removed via wet etching, dry etching, and/or other suitable techniques.

As shown in FIG. 3H, the process also includes forming a barrier material 114 on the top wall 108c of the epitaxial silicon structures 108. The barrier material 114 can have a generally similar composition or a different composition than that of the insulating material 112. In one embodiment, the barrier material 114 can include silicon dioxide ($SiO_2$) formed via thermal oxidation. In other embodiments, the barrier material 114 can also include other suitable materials formed via CVD, ALD, and/or other suitable techniques.

Figure 3I:
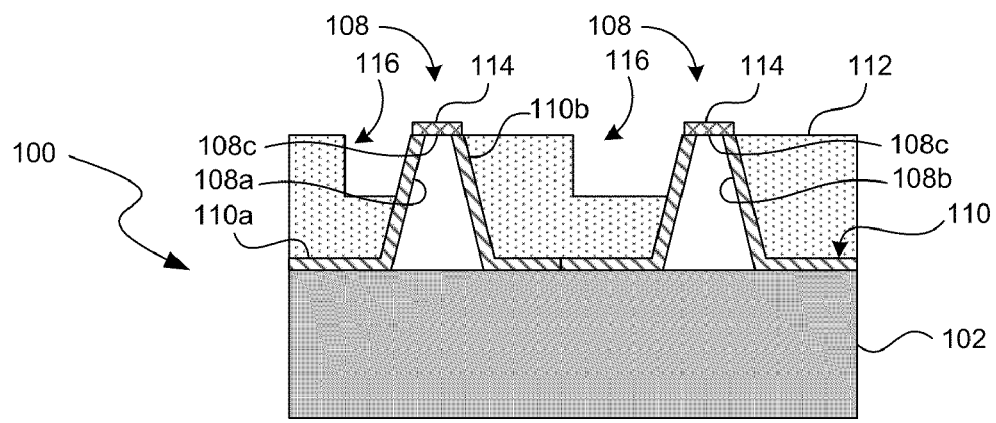

FIG. 3I shows another stage of the process, in which a portion of the insulating material 112 is removed to form second openings 116 that expose at least parts of the second portion 110b of the optional buffer material 110. The exposed parts of the second portion 110b all have the same crystal orientation (e.g., generally similar to Si(1,1,1)). In one embodiment, removing a portion of the insulating material 112 includes depositing a photoresist (not shown) on the insulating material 112, patterning the photoresist to define the second openings 116, and removing a portion of the insulating material 112 to form the second openings 116. In other embodiments, the second openings 116 may be formed via other suitable techniques.

Figure 3J:
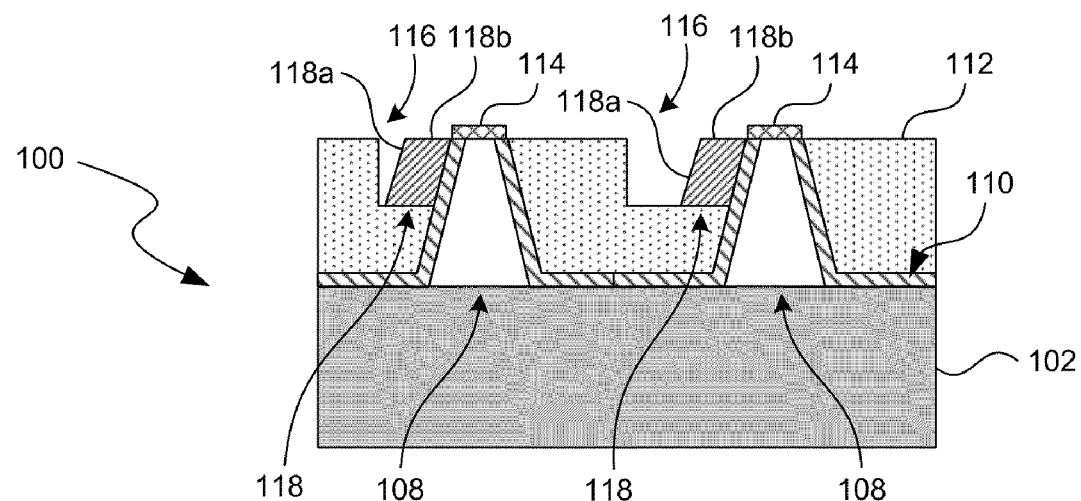
Figure 3K:
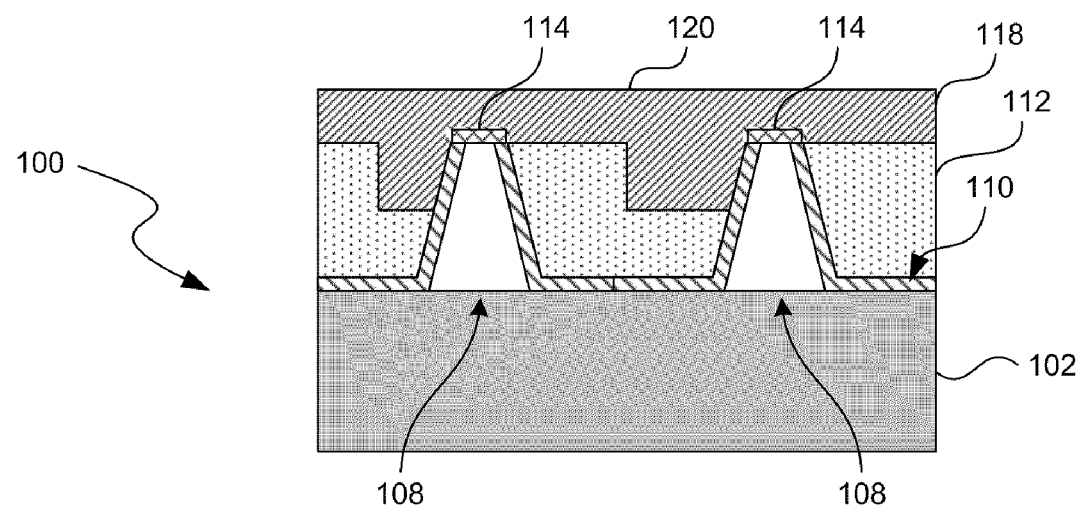

FIGS. 3J-3K show another stage of the process, in which a semiconductor material 118 is deposited over the first or second sidewalls 108a and 108b of the epitaxial silicon structures 108. In the illustrated embodiment, the semiconductor material 118 includes N-type GaN. In other embodiments, the semiconductor material 118 can include P-type GaN, InGaN, GaN/InGaN MQWs, and/or other suitable semiconductor materials deposited via MOCVD, MBE, LPE, HYPE, and/or other suitable techniques.

FIG. 3J shows the deposited semiconductor material 118 during an initial stage of the deposition process. During the initial deposition stage, the deposited semiconductor material 118 has a first surface 118a and a second surface 118b. Without being bound by theory, it is believed that the first surface 118a of the semiconductor material 118 is formed along the c-plane with a Millar index of (0001) because the first or second sidewall 108a and 108b of the epitaxial silicon structures 108 has the Si(1,1,1) crystal orientation. It is also believed that the second surface 118b of the semiconductor material 118 can have a semi-polar or non-polar crystal orientation. For example, in the illustrated embodiment, the second surface 118b has a semi-polar crystal orientation with a Millar index of (1$\bar{1}$01). In other examples, the second surface 118b can have other suitable semi-polar or non-polar crystal orientations by adjusting a deposition temperature, a deposition duration, a deposition precursor composition, and/or other suitable operating parameters.

FIG. 3K shows another state of the deposited semiconductor material 118 during a later stage of the deposition process. As shown in FIG. 3K, the deposited semiconductor material 118 has a semiconductor surface 120 that extends away from the substrate material 102. Without being bound by theory, it is believed that the semiconductor surface 120 has the same crystal orientation as the second surface 118b (FIG. 3J) of the semiconductor material 118. In the illustrated embodiment, the semiconductor surface 120 is generally planar and parallel to the substrate surface 103 of the substrate material 102. In other embodiments, the semiconductor surface 120 may form a slanted angle with respect to the substrate surface 103 of the substrate material 102. Subsequently, the process can include depositing InGaN, GaN/InGaN MQWs, P-type GaN, and/or other suitable semiconductor materials to form cladding structures, active regions, and/or other suitable components of an LED, LD, and/or other suitable types of SSL devices.

SSL devices (e.g., LEDs) produced according to several embodiments of the process discussed above can have increased optical efficiency when compared to conventional devices. For example, the GaN/InGaN MQW 16 of the LED 10 in FIG. 1 is typically grown along the c-axis (FIG. 2A). Without being bound by theory, it is believed that the GaN/InGaN materials grown along the c-axis are polarized with an induced internal electric field generally perpendicular to the direction of growth. It is also believed that the internal electric field can slant the energy bands of the active region and can spatially prevent some of the electrons in the N-type GaN material 14 (FIG. 1) from recombining with holes in the P-type GaN material 18 (FIG. 1) during operation. The low recombination rate can result in a low optical efficiency of the LED 10. As a result, by forming the semiconductor material 118 on a semi-polar or non-polar plane, the induced internal electric field can be reduced. Thus, the recombination rate in the SSL device may be increased to improve the optical efficiency.

Several embodiments of the process discussed above can also have lower manufacturing costs when compared to conventional techniques. According to conventional techniques, the GaN/InGaN materials 14, 16 and 18 (FIG. 1) are typically grown on silicon wafers with the Si(1,1,1) crystal orientation. Such silicon wafers can be expensive to produce because conventional techniques typically yield the Si(1,0,0) crystal orientation. As a result, several embodiments of the process discussed above can have lower manufacturing costs because the substrate material 102 can include a silicon wafer with the Si(1,0,0) crystal orientation, but provide the advantages normally associated with Silicon wafers having a Si(1,1,1) crystal structure.

Even though particular operations are discussed above for exposing at least a portion of the first or second sidewalls 108a and 108b of the epitaxial silicon structures 108, in certain embodiments other techniques can also be used in addition to or in lieu of the operations discussed above. For example, FIGS. 4A-4C show another technique for exposing the first or second sidewalls 108a and 108b of the epitaxial silicon structures 108.

Figure 4A:
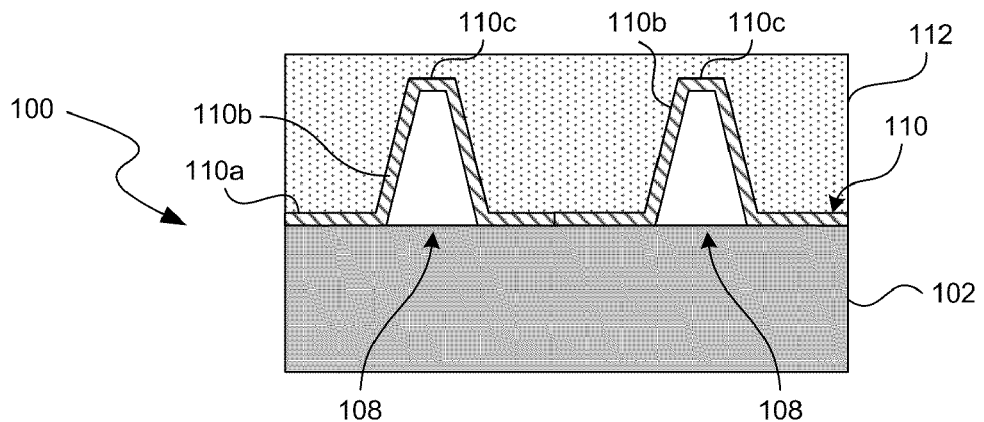
FIGS. 4A-4C are cross-sectional views of a portion of a microelectronic substrate undergoing a process of forming another SSL device in accordance with embodiments of the technology.
Figure 4B:
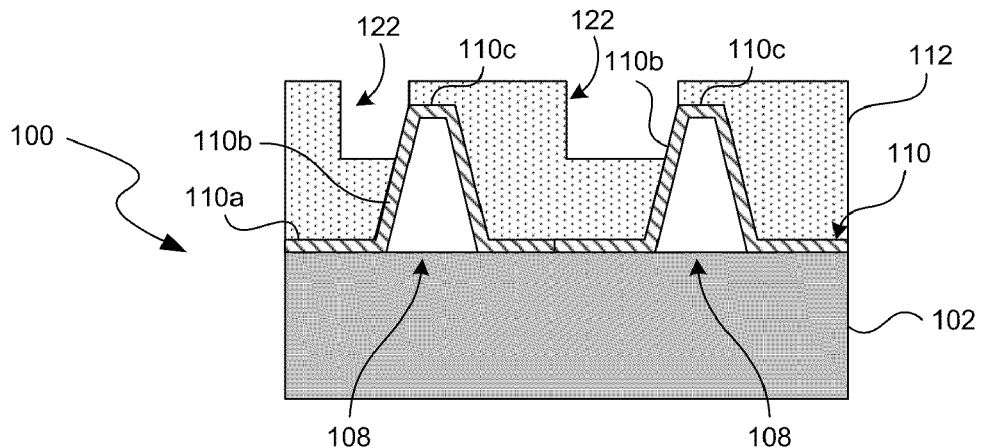
Figure 4C:
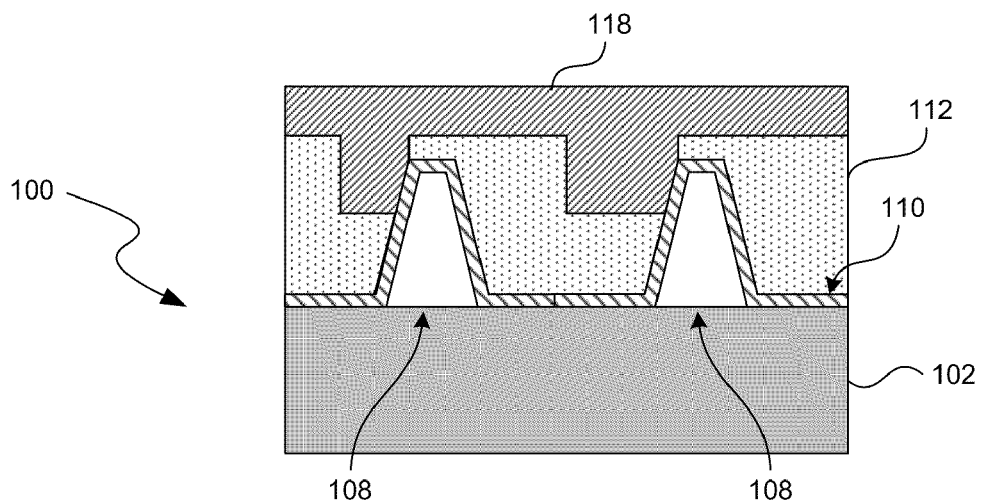

As shown in FIG. 4A, a stage of the process can include depositing the insulating material 112 onto the substrate material 102. The deposited insulating material 112 substantially encapsulates the buffer material 110 and the epitaxial silicon structures 108. As shown in FIG. 4B, a subsequent stage of the process can include removing a portion of the insulating material 112 to form a plurality of third openings 122 in the insulating material 112. The third openings 122 expose at least a part of the second portion 110b of the optional buffer material 110. During the removal operation, the insulating material 112 can be patterned such that the third portion 110c of the optional buffer material 110 is not exposed after the portion of the insulating material 112 is removed. As shown in FIG. 4C, the semiconductor material 118 can then be deposited onto the microelectronic substrate 100 as discussed above with reference to FIGS. 3J and 3K.

Figure 5A:
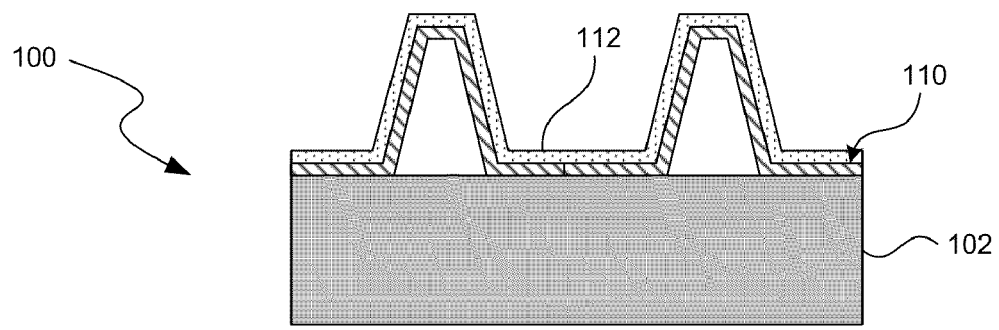
FIGS. 5A-5C are cross-sectional views of a portion of yet another microelectronic substrate undergoing a process of forming an SSL device in accordance with embodiments of the technology.
Figure 5B:
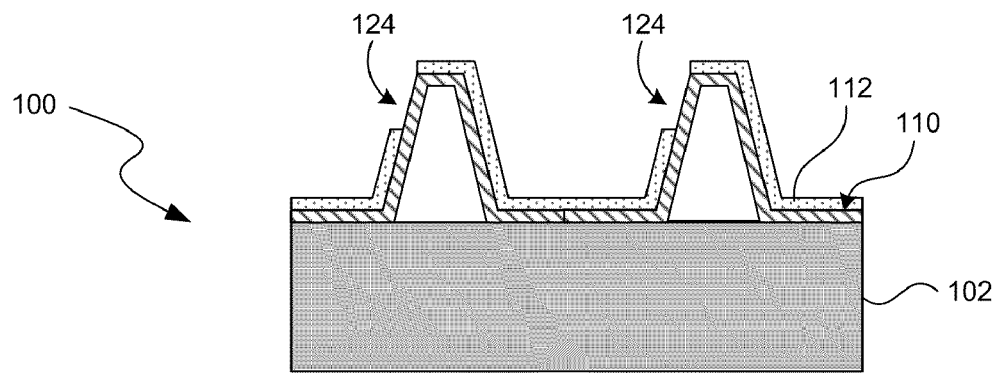

Even though the insulating material 112 is shown in FIGS. 3A-4C as having a generally planar surface spaced apart from the substrate material 102, in certain embodiments, the insulating material 112 can also conform generally to the substrate material 102 and/or the epitaxial silicon structures 108, as shown in FIG. 5A. A portion of the generally conformal insulating material 112 can be removed to form a plurality of fourth openings 124 in the insulating material 112 (FIG. 5B).

Figure 5C:
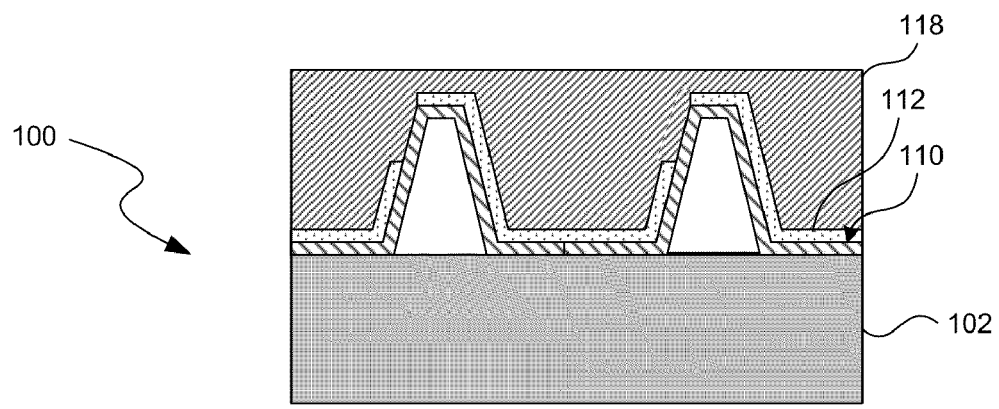

The fourth openings 124 expose at least a part of the second portion 110b of the optional buffer material 110, as described above with reference to FIG. 4B. As shown in FIG. 5C, the semiconductor material 118 can then be deposited onto the microelectronic substrate 100 as discussed above with reference to FIGS. 3J and 3K.

From the foregoing, it will be appreciated that specific embodiments of the technology have been described herein for purposes of illustration, but that various modifications may be made without deviating from the disclosure. Many of the elements of one embodiment may be combined with other embodiments in addition to or in lieu of the elements of the other embodiments. Accordingly, the disclosure is not limited except as by the appended claims.

I claim:

1. A method for processing a microelectronic substrate, comprising:
    depositing a masking material on a substrate surface of a substrate material;
    forming an opening in the masking material, the opening exposing a portion of the substrate surface;
    depositing silicon (Si) onto the exposed portion of the substrate surface via the opening, the deposited silicon having a sidewall extending away from the substrate surface; and
    depositing a semiconductor material on the sidewall of the silicon, the semiconductor material having a semiconductor surface spaced apart from the substrate surface, the semiconductor surface being at a semi-polar or non-polar crystal plane of the semiconductor material.

2. The method of claim 1 wherein:
    depositing the masking material includes:
        depositing a masking material containing silicon nitride (SiN) onto the substrate surface via chemical vapor deposition; and
        patterning the deposited masking material via photolithography;
    forming the opening includes removing a portion of the deposited masking material to form the opening;
    depositing silicon (Si) includes depositing silicon (Si) onto the exposed portion of the substrate surface via at least one of metal-organic CVD ("MOCVD"), molecular beam epitaxy ("MBE"), liquid phase epitaxy ("LPE"), and hydride vapor phase epitaxy ("HVPE") to form an epitaxial silicon structure, the epitaxial silicon structure having the sidewall extending away from the substrate surface and a top wall spaced apart from the substrate surface; and
    depositing the semiconductor material includes:
        encapsulating the substrate material and the epitaxial silicon structure with an insulating material;
        selectively removing a portion of the insulating material to expose a portion of the sidewall of the epitaxial silicon structure while the substrate surface and the top wall of the epitaxial silicon structure are encapsulated by the insulating material; and
        depositing the semiconductor material onto the exposed portion of the sidewall via at least one of MOCVD, MBE, LPE, and HVPE.

3. The method of claim 1 wherein:
    depositing silicon (Si) includes depositing silicon (Si) onto the exposed portion of the substrate surface via epitaxial growth to form an epitaxial silicon structure;
    the deposited epitaxial silicon structure has the sidewall extending away from the substrate surface and a top wall spaced apart from the substrate surface;
    the top wall of the epitaxial silicon structure has a Si(1,0,0) crystal orientation; and
    the sidewall of the epitaxial silicon structure has a Si(1,1,1) crystal orientation.

4. The method of claim 1 wherein:
    depositing silicon (Si) includes depositing silicon (Si) onto the exposed portion of the substrate surface via epitaxial growth to form an epitaxial silicon structure;
    the deposited epitaxial silicon structure has the sidewall extending away from the substrate surface and a top wall spaced apart from the substrate surface;
    the top wall of the epitaxial silicon structure has a Si(1,0,0) crystal orientation;
    the sidewall of the epitaxial silicon structure has a Si(1,1,1) crystal orientation; and
    depositing a semiconductor material includes:
        insulating the top wall of the epitaxial silicon structure with an insulating material; and
        depositing the semiconductor material onto the sidewall of the epitaxial silicon structure while the top wall is insulated with the insulating material.

5. The method of claim 1 wherein:
    depositing silicon (Si) includes depositing silicon (Si) onto the exposed portion of the substrate surface via epitaxial growth to form an epitaxial silicon structure;
    the deposited epitaxial silicon structure has the sidewall extending away from the substrate surface and a top wall spaced apart from the substrate surface;
    the top wall of the epitaxial silicon structure has a Si(1,0,0) crystal orientation;
    the sidewall of the epitaxial silicon structure has a Si(1,1,1) crystal orientation; and
    depositing a semiconductor material includes:
        insulating the top wall of the epitaxial silicon structure and the substrate surface of the substrate material with an insulating material; and
        depositing the semiconductor material onto the sidewall of the epitaxial silicon structure while the top wall and the substrate surface of the substrate material are insulated with the insulating material.

6. The method of claim 1 wherein:
    depositing silicon (Si) includes depositing silicon (Si) onto the exposed portion of the substrate surface via epitaxial growth to form an epitaxial silicon structure;
    the deposited epitaxial silicon structure has the sidewall extending away from the substrate surface and a top wall spaced apart from the substrate surface;
    the top wall of the epitaxial silicon structure has a Si(1,0,0) crystal orientation;
    the sidewall of the epitaxial silicon structure has a Si(1,1,1) crystal orientation; and
    depositing a semiconductor material includes:
        insulating the top wall of the epitaxial silicon structure and the substrate surface of the substrate material with an insulating material;
        depositing the semiconductor material onto the sidewall of the epitaxial silicon structure while the top wall and the substrate surface of the substrate material are insulated with the insulating material; and
        the deposited semiconductor material has a first surface with a crystal orientation with a Miller index of ($1\bar{1}01$) and a second surface with a crystal orientation with a Miller index of (0001).

7. The method of claim 1 wherein:
    depositing silicon (Si) includes depositing silicon (Si) onto the exposed portion of the substrate surface via epitaxial growth to form an epitaxial silicon structure;

the deposited epitaxial silicon structure has the sidewall extending away from the substrate surface and a top wall spaced apart from the substrate surface;
the top wall of the epitaxial silicon structure has a Si(1,0,0) crystal orientation;
the sidewall of the epitaxial silicon structure has a Si(1,1,1) crystal orientation; and
depositing a semiconductor material includes:
insulating the top wall of the epitaxial silicon structure with a barrier material;
insulating the substrate surface of the substrate material with an insulating material;
depositing the semiconductor material onto the sidewall of the epitaxial silicon structure while the top wall and the substrate surface of the substrate material are insulated with the barrier material and the insulating material, respectively; and
the deposited semiconductor material has a first surface with a crystal orientation with a Miller index of ($1\bar{1}01$) and a second surface with a crystal orientation with a Miller index of (0001).

8. The method of claim 1 wherein:
depositing the semiconductor material on the sidewall of the silicon comprises depositing an N-type GaN material on the sidewall of the silicon, the semiconductor surface being defined by an N-type GaN surface spaced apart from the substrate surface; and
the method further comprises—
depositing a GaN/InGaN multiple quantum wells on the N-type GaN surface; and
depositing a P-type GaN material on the GaN/InGaN multiple quantum wells.

9. A method for processing a microelectronic substrate, comprising:
depositing a masking material on a substrate surface of a substrate material;
forming an opening in the masking material, the opening exposing a portion of the substrate surface;
depositing silicon (Si) onto the exposed portion of the substrate surface via the opening, the deposited silicon having a sidewall extending away from the substrate surface;
depositing a buffer material on the substrate surface and the deposited silicon (Si), the buffer material having a first portion on the substrate surface and a second portion on the sidewall of the deposited silicon (Si); and
insulating the first portion of the buffer material with an insulating material; and
depositing a semiconductor material on at least a part of the second portion of the buffer material via epitaxial growth.

10. The method of claim 9 wherein insulating the first portion of the buffer material includes encapsulating the first and second portions of the buffer material and selectively exposing at least a part of the second portion of the buffer material.

11. The method of claim 9 wherein insulating the first portion of the buffer material includes:
encapsulating the first and second portions of the buffer material with the insulating material;
patterning the insulating material to define an aperture generally corresponding to at least a part of the second portion of the buffer material; and
removing a portion of the insulating material via the defined aperture to expose the second portion of the buffer material.

12. The method of claim 9 wherein:
the deposited silicon (Si) has a top wall spaced apart from the substrate surface;
the buffer material includes a third portion generally corresponding to the top wall of the deposited silicon (Si); and
the method further includes:
encapsulating the first, second, and third portions of the buffer material with the insulating material;
polishing the insulating material to expose the third portion of the buffer material;
removing the third portion of the buffer material via wet etching;
forming a barrier material on the top wall of the deposited silicon (Si);
patterning the insulating material to define an aperture generally corresponding to at least a part of the second portion of the buffer material; and
removing a portion of the insulating material via the defined aperture to expose the second portion of the buffer material.

13. The method of claim 9 wherein depositing the semiconductor material on at least a part of the second portion of the buffer material comprises depositing N-type GaN material, a P-type GaN material, and/or GaN/InGaN multiple quantum wells on at least a part of the second portion of the buffer material.

* * * * *

UNITED STATES PATENT AND TRADEMARK OFFICE
CERTIFICATE OF CORRECTION

PATENT NO.        : 8,372,671 B2  
APPLICATION NO.   : 12/819672  
DATED             : February 12, 2013  
INVENTOR(S)       : Jaydeb Goswami It is certified that error appears in the above-identified patent and that said Letters Patent is hereby corrected as shown below:

On the Title Page, Item (54), and in the specification, column 1, line 1, under "Title", after "STATE" insert -- LIGHTING --.

Signed and Sealed this  
Seventh Day of May, 2013

Teresa Stanek Rea  
*Acting Director of the United States Patent and Trademark Office*